United States Patent [19]

Billows

[11] 3,971,276

[45] July 27, 1976

[54] PICTURE COMPOSING TECHNIQUES AND APPARATUS THEREFOR

[76] Inventor: Leonard Kay Billows, 1 Longdean Park, Hemel Hempstead, Hertfordshire, England

[22] Filed: Aug. 6, 1973

[21] Appl. No.: 385,638

[30] Foreign Application Priority Data
Aug. 9, 1972 United Kingdom............... 37178/72

[52] U.S. Cl. .................................. 83/164; 83/658; 83/560; 83/123
[51] Int. Cl.² .......................................... B26D 7/18
[58] Field of Search ............... 83/164, 123, 560, 97, 83/565, 86, 125, 562, 658

[56] References Cited
UNITED STATES PATENTS

| 826,394 | 7/1906 | Whitlock | 83/56 |
|---|---|---|---|
| 1,599,331 | 9/1926 | Karaban | 83/164 |
| 2,785,751 | 3/1957 | Jones | 83/560 |
| 3,060,782 | 10/1962 | Burgess | 83/658 |
| 3,180,183 | 4/1965 | Stanley et al. | 83/560 X |
| 3,234,593 | 2/1966 | Lerner et al. | 83/658 X |
| 3,344,519 | 10/1967 | Goodman | 83/123 X |

Primary Examiner—Donald R. Schran
Attorney, Agent, or Firm—Brisebois & Kruger

[57] ABSTRACT

A montage or "light" table comprising a structure movable along the table, and a punch mechanism mounted upon the structure for movement relatively thereto across the table, the punch mechanism comprising a hollow cutting punch, and means for reciprocating the hollow cutting punch to effect a punching operation by cutting.

5 Claims, 11 Drawing Figures

PICTURE COMPOSING TECHNIQUES AND APPARATUS THEREFOR

This invention relates to picture composing techniques and apparatus therefor and has particular reference to techniques and apparatus for securing accurate registration of film separation transparencies, for example colour separations.

The problem of accurate registration of sets of colour separations is especially acute where a number of separate colour pictures are to appear on the same page, sheet, plate or web. In one conventional method, the positions of the separate pictures are marked on a layout sheet commonly a sheet of translucent material, i.e. paper or film which is placed on a montage table usually a light table. A carrier sheet is then placed over the layout sheet and the first group of colour separations usually the black separations of each set are placed in the positions indicated by the layout sheet and fixed to the carrier sheet by glue or adhesive tape. The carrier sheet is translucent usually a film type material, e.g. that known under the Trade Mark "Melanex". The positions of the first group of colour separations simply determine the positions of the colour pictures and absolute positional accuracy is not essential. The carrier sheet complete with a group of colour separations mounted on it is usually known as a flat. This first flat is now used as the key for the positions of the other groups of colour separations when mounting them on their respective carrier sheets and the layout sheet is no longer used.

To make up the second flat — the first flat is placed on a light table and a carrier sheet is then placed over it and the second group of colour separations are placed in position on the carrier sheet. It is necessary to position the second colour separation of each set extremely accurately with respect to the first colour separation of the set and this is done manually by an operator who registers the second colour separation relative to the first while viewing them through a magnifying glass. Accurate registration is extremely important because lack of registration results in an "out of focus" image. After registration has been effected, each second colour separation is fixed to the second carrier sheet by glue or adhesive tape.

The third, fourth and any further colour separations of each set are dealt with in a manner similar to that of the second colour separation, separate carrier sheets being used to carry each group of colour separations. The sheets and their attached colour separations are then used in the conventional manner to produce printing plates for the separate colours.

Such a process is extremely time consuming and tedious and is very dependent upon the skill of the operator.

In an alternative method, the carrier sheets have preformed location holes in them which register with location pins on the light table. The unexposed colour films also have location holes which serve to ensure that each film is in exactly the same position in the camera while the film is exposed, the same holes then enabling accurate registration of the colour separations of a set to be effected. The carrier sheets are placed on the light table with a layout sheet on top, registration of the sheets being effected by means of the location holes and pins. The sets of colour separations are then located in the positions set out on the layout sheet and two registration holes are then drilled through each set of colour separations and through the layout and carrier sheets. Subsequently, the carrier sheets are separated and the appropriate ones of the colour separations of the sets are located in position using location holes and then secured in place. Printing plates can then be produced in the conventional manner.

The alternative method is not entirely satisfactory because it is found that if the location holes in the sets of colour separations and sheets are drilled by a rotary drill, the rotation of the drill tends to rotate the separations in the direction of rotation of the drill and this produces positional errors. In addition, it is impossible to manufacture the drill components accurately circular and there is always a small but perceptible degree of eccentricity. An eccentricity of about 0.1 mm is not unusual. Thus, the drill rotates on an elliptical orbit and this results in inaccurate misaligned holes. The misalignment is increased as the drill goes through each layer because, the drill being hollow cuts a disc of material from one layer and this rubs against a succeeding layer. It is found that the holes drilled in the uppermost layers of a plurality of layers tend to be larger than those drilled in the lowermost layer. A hole is first drilled in the uppermost layers and then the drill continues to rotate in those layers as the middle and lowermost layers are drilled and the maintained rotation enlarges the holes in the upper layers.

It has also been proposed to punch the holes but this has not proved entirely satisfactory because distortion of the holes is found to occur during punching and this results in positional inaccuracies of the colour separations. A solid punch is used in conjunction with a conventional die located under the layers being punched to produce the holes by a shearing action. Such an arrangement requires complete accuracy in the location of the die and is impracticable for this and other reasons. Thus, when a solid punch is used to punch holes in several superposed layers, it is found that the die is really effective only for the lowermost layer and that for the upper layers the lower layer or layers tend to act as a surface against which the solid punch operates. Such a surface is not rigid and is not apertured like a die and this produces distortion of the holes produced in the uppermost layers.

The present invention provides a method of effecting registration of one or more sets of colour separations with respect to at least one carrier sheet in which registration holes are punched in each set and the carrier sheets by means of a hollow cutting punch.

Preferably, the cutting punch is cleared periodically of any punched-out discs which may have adhered to it.

Advantageously, the cutting punch is employed having a movable core member which is reciprocated relatively to the punch to clear the latter of punched-out discs.

The relative reciprocation may take place as the cutting punch is withdrawn after a punching operation. Punched-out discs are preferably ejected from the punch into a receptacle which is movable to a position beneath the punch to receive the discs and to another position clear of the path of movement of the punch.

Alternatively, the punched-out discs may be allowed to travel along the hollow cutting punch to a collecting space from which they are removed by entraining them in a flow of air through the space. The air flow may be used to convey the discs to a collecting box.

Instead of removing the discs by the entrainment method just described, the discs may be allowed to accumulate in the collecting space until they reach an outlet through which the discs pass, for example to a collecting box, as further discs enter the collecting space.

Yet again, removal of the discs may be effected by an air blast directed into the hollow punch. Means may be provided for bringing the air blast into operation at a predetermined time in a punching operation.

By way of example only, a method and apparatus embodying the invention will now be described in more detail with reference to the accompanying drawings of which:

Figure 1:
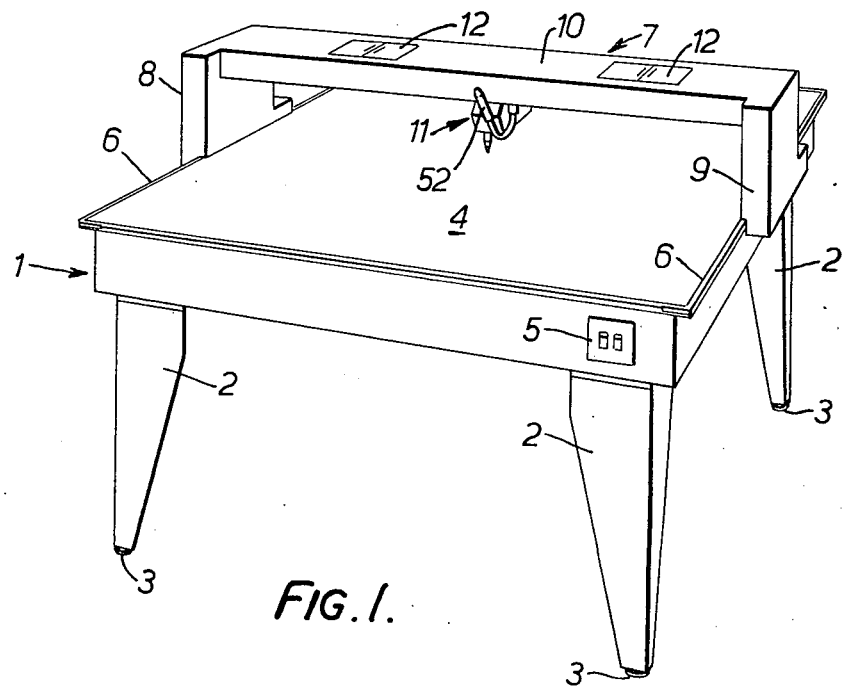
FIG. 1 is a perspective view of a montage or "light" table.

The table shown in FIG. 1 is of heavy, rigid construction comprising a rectangular framework 1 supported upon four legs 2 one at each corner of the framework. Each leg has a levelling device 3 at its lower end, adjustment of which ensures that the surface of the table is absolutely level. The framework 1 supports a surface 4 of a translucent plastics material and houses a number of fluorescent tubes (not shown) to provide back illumination of transparencies laid upon the surface 4. Switches for controlling the tubes are shown at 5.

The framework 1 also supports, along opposite edges of the surface 4 strip-like members 6 which, between them, form guide surfaces for a travelling support structure indicated generally by reference numeral 7 and described in more detail later. The structure 7 is able to traverse backwards and forwards along the table, suitable stops (not shown) being provided at the limits of movement. The members 6 may carry measuring scales or other marks to indicate extent of movement of the structure 7.

The structure 7 comprises members 8, 9 and a cross member 10. The member 10 carries a punch mechanism 11 that can be traversed along the length of the cross member and thus across the table. In this way, the punch mechanism 10 can be positioned at will accurately over any part of a selected area of the surface 4.

The cross member 10 is also fitted with recesses for holding small accessories, the recesses being closed by pivotally mounted closures 12.

The montage table will now be described in greater detail with reference to FIGS. 2–5.

Figure 2:
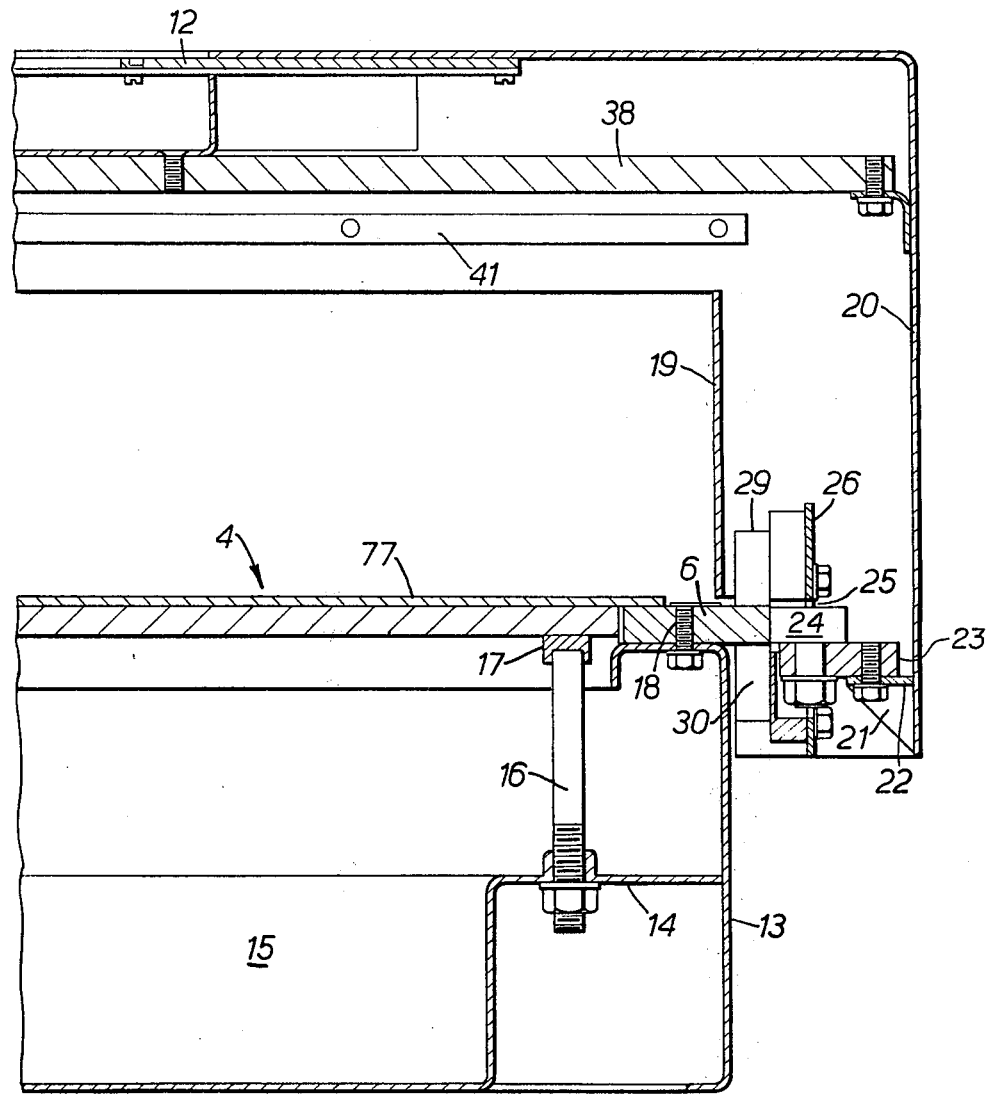
Figure 4:
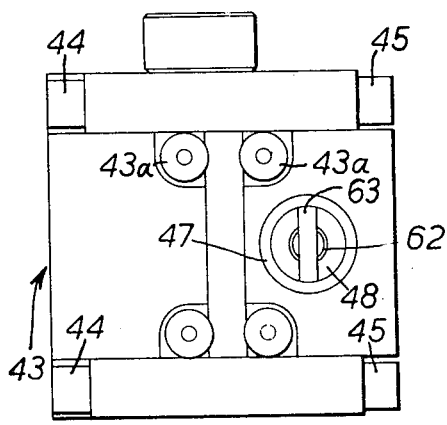

The framework 1 is of generally box-like form with side walls 13 and an internal floor 14 with a central recess 15 for housing the fluorescent tubes referred to above. The surface 4 is supported above the floor 14 by means of adjustable bolts one 16 of which is seen in FIG. 2. A pad 17 of resilient material protects the surface 4.

The strip-like members 6 are bolted to the side walls 13 by bolts such as 18 (FIG. 2) and are positioned to provide a guide surface clear of the side walls 13.

The side members 8, 9 are each of sheet metal construction and of similar form with inner and outer walls 19, 20 (FIG. 2). Supported adjacent the lower end of wall 20 by means of angle pieces 21 is a ledge 22 to which is bolted a support member 23 on which a guide roller 24 is mounted for rotation about a vertical axis. The guide roller co-operates as shown with the edge of the adjacent strip 6.

The support member 23 and guide roller 24 project through a window 25 in a mounting plate assembly 26 secured between the front and back walls 27, 28 respectively of the side member. Plate assembly 26 carries pairs of guide rollers 29, 30 mounted to rotate about horizontal axes as shown and which co-act with the upper and lower surfaces respectively of the adjacent strip-like member 6.

Figure 3:
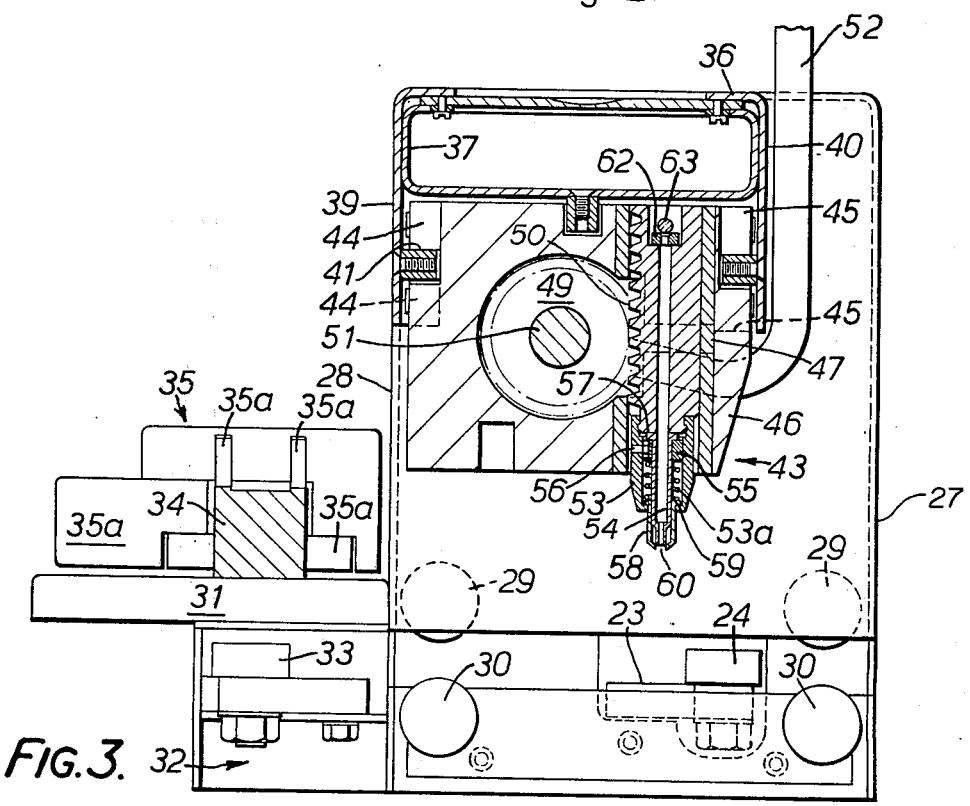
FIGS. 2–6 are sections of parts of the table shown in FIG. 1.

Secured to the wall 28 and movable with the structure 7 is a sub-assembly comprising an extension plate 31 to the under-surface of which is bolted a support 32 for a guide roller 33 mounted for rotation about a vertical axis and coacting with the outside edge of the adjacent strip-like member 6. Secured to the plate 31 but not shown in FIG. 3 is a housing for receiving the end of a beam 34 that extends across the table between the housings on the two plates 31. The beam supports a carriage 35 movable along the beam by means of guide rollers 35a. The upper surface of the beam is marked to provide a measuring scale and the carriage is adapted to receive a writing instrument, for example a ballpoint pen or a scribing tool. The structure just described allows an operator to rule up or scribe a surface and can be used to make-up the layout sheet referred to later. It is, of course, not essential that the structure just described be permanently attached to the travelling support structure and it may form a separate entity and be usable separately.

As has been explained above, the side members 8, 9 are joined by a cross member 10 also of sheet metal construction comprising an inverted channel member 36 within which is fixed a box member 37 to whose lower surface is secured a transverse guide 38. The side walls 39, 40 of the member 36 also support transverse guides 41, 42 respectively. Mounted for movement along the guides 38, 41, 42 is a head 43 forming part of the punch mechanism. The head carries guide rollers 43a, 44, 45 that co-operate respectively with the guides 38, 41 and 42. The head has a vertical passageway 46 in which is located a liner 47. A punch carrier 48 is mounted for sliding motion along the liner 47 under the control of a pinion 49 in mesh with a rack 50 machined into the surface of the carrier 48. The pinion 49 is fixed to an angle 51 itself secured to an operating handle 52 located to one side of the head 43.

To the lower end of the punch carrier 48 is detachably secured a punch holder 53 inside which is a hollow punch 54 supported in position by a collar 55 secured to the wall of the holder 53 and by a grub screw 56. The collar seats against a flange 57 on the punch 54. There is limited clearance between the head of the grub screw 56 and the corresponding hole in the collar so that the latter is able to move axially slightly with respect to the holder 53. The collar is urged upwardly as seen in FIG. 3 to keep the flange 57 in contact with the lower face of the punch carrier 48 by a spring 53a located between the collar and an outward flange 59 on a pressure pad and stripper 58. The pressure pad and stripper 58 is of generally cylindrical shape with an end aperture 60 and is slidable within the lower part of the punch holder 53 against the action of the spring 53a that urges the pressure pad and stripper 58 into the position shown in FIG. 3. The end aperture 60 permits projecting movement of the punch 54 as will be described later. Extending axially through the carrier 48 and punch 54 is an ejector rod 61 whose lower end is conincident with the cutting edge of the punch 54 and whose upper end carries a plate 62 that is in contact with a transverse rod 63 that limits the upward movement of the punch carrier 48.

One end face of the head 43 is contoured to accommodate both a cam member 64 (FIG. 5) fixed to the axle 51, and an arm 65 pivotally mounted at one end and supporting at the other end a tray 67. An end plate 68 (FIG. 6) fits over the end face of the head 43 and is recessed to receive the projecting head of the pin 69 mounting the arm 65. The arm 65 is biassed into contact with the cam member 64 by a spring 70 located between the head of the pin 69 and the arm 65 as shown in FIG. 6. Clockwise rotation of the cam member 64 and thus downward movement of the punch carrier 48 is limited by an adjustable stop member 64a.

The construction of the travelling support structure 7 described above allows the punch mechanism 11 to be moved with extreme accuracy to any position above the working surface of the montage table. The cross member 10 is maintained at all times in strict parallelism with the table end edge and the mechanism 11 is movable smoothly and without play along the cross member.

Figure 7:
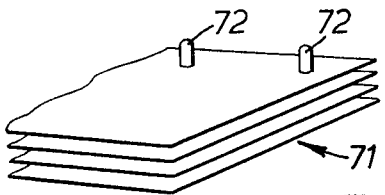
FIGS. 7–11 are explanatory diagrams.

In a typical registration process embodying the invention, the sets of colour separations employed each comprise four separations. Registration of the separations of a set relative to each other is achieved either by employing film which, prior to exposure, has location holes already formed in it or by visually placing the separations of a set in registration and then punching registration holes in the registered separations. FIG. 7 shows in perspective a set 71 of separations held in registration by two location pins 72 in registration holes in the separations. In FIG. 7, the separations are shown somewhat widely spaced apart but this is simply for purposes of clarity, in practice the separations will be in close contact one with the other.

Figure 8:
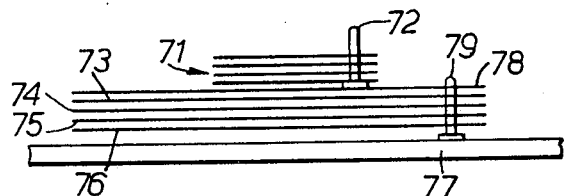
Figure 9:
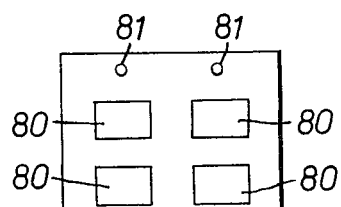
Figure 10:
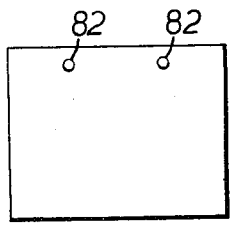

The next stage is to locate the positions of the sets on the carrier sheets and for this purpose, and as shown in FIG. 8, four carrier sheets 73, 74, 75 and 76 are placed in position on the montage table on a base 77 of soft material, for example of a plastics material which may be polyvinyl chloride, and a layout sheet 78 is placed on top of the carrier sheets. The carrier sheets have previously been punched with location holes and registration pins 79 in those holes keep the carrier sheets correctly positioned. FIG. 9 shows the layout sheet 78 marked as at 80 to show the positions in which the pictures are to be located. As can be seen, the layout sheet 78 has location holes 81. FIG. 10 shows a carrier sheet with its location holes 82. The sets of separations are then located in the appropriate positions on the layout sheet and secured in position with, for example adhesive tape. Then, using the punch mechanism 11, holes are punched by cutting through all the sets of separations and the carrier sheets. Such holes are located outside the image area on the separations with the hole centres as far apart as possible. The assembly is then taken apart and each colour separation is located, by means of registration pins in the holes just punched, in its correct position on its own carrier sheet and then secured by means, for example, of adhesive tape or glue.

The carrier sheets with their colour separations — the "flats" are then used to produce printing plates, these latter having location holes in them corresponding to the location holes in the carrier sheets. Subsequently, the location holes in the plates are used to locate the latter on the printing cylinders of a printing press and in this manner a reduction in the time taken to set up the press is effected.

Punching is effected by moving the punch mechanism over the surface of the table until the punch 54 is located directly above the site of the required location hole and then operating the handle 52 in a clockwise direction as seen in FIG. 3. Rotation of the handle 52 rotates the axle 51 and with it the pinion 49. Rotation of the pinion 49 imparts a downward movement to the punch carrier 48 and with it the punch 54. As the downward movement continues the lower end of the pressure pad and stripper 58 contacts the surface to be punched and movement of the component 58 stops. However, the punch 54 continues its downward movement, the cutting edge of the punch moving through the opening 60 and then punching the required registration hole. During this downward movement the pressure pad and stripper 58 exerts a slight downward pressure on the surface being punched and this helps to hold the surface steady during punching. In addition, the ejector rod 61 follows the punch but as punching takes place, discs punched from the various sheets through which the punch passes build up inside the hollow punch and cause slight upward movement of the rod 61 relative to the punch carrier 48. At the end of the punching operation, the punch is withdrawn by anti-clockwise rotation of the handle 52. As the components move towards the positions shown in FIG. 3 the pressure pad and stripper 58 is, initially, maintained in contact with the surface and this assists the separation of the punch and the surface. On further movement, the head 62 comes into contact with the transverse rod 63 and upward movement of the rod 61 ceases to allow the punch itself to continue to move upwardly. Discs within the hollow punch are thus ejected and fall into the tray 67.

A further punching operation can now be effected.

Figure 11:
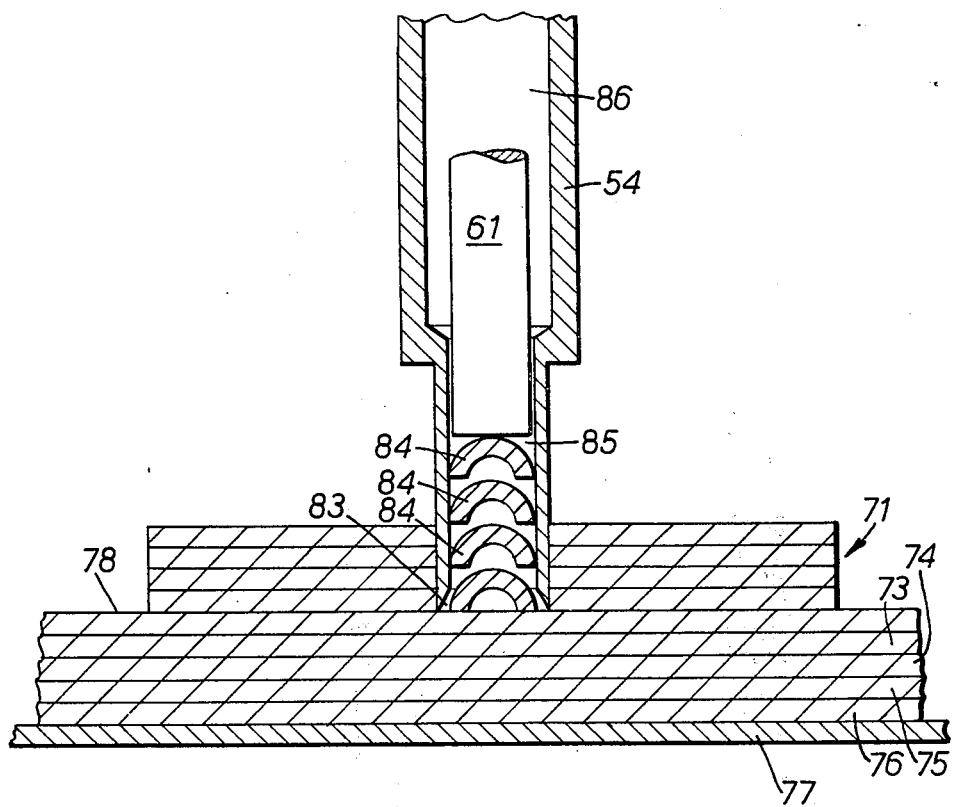

FIG. 11 shows the actual punching process on an enlarged scale. The hollow cutting punch 54 has a bevelled cutting edge 83, the outside circumference of which actually performs a cutting operation as the punch is moved downward through the layers being punched. The punch does not, therefore, operate in the conventional manner in which a hole is produced by shearing the layers between a solid punch and a cooperating die. FIG. 11 also shows how punched-out discs 84 accumulate inside the hollow cutting punch 54 as the latter moves through the several layers. Because cutting is effected by the outside circumference of the cutting edge 83, the diameter of the discs 84 is slightly larger than the bore 85 of the punch 54 and thus the discs 84 distort slightly into a domed form as they move into the bore 85. This "doming" is assisted by the bevelled cutting edge. As one disc 84 is cut it is moved up the bore 85 by the succeeding disc and in this way, the cutting edge is kept unobstructed and each surface is cut accurately. Punching by cutting of the lowermost carrier sheet 76 is cushioned by the base 77 of soft material. The punch 54 does not, of course, penetrate the base 77 because by the time the punch 54 has moved downwardly by a distance sufficient to punch the lowermost carrier sheet 76, cam member 64 has come into contact with stop member 64a and further downward movement of the punch 54 is prevented.

The pressure pad and stripper 58 and ejector rod 61 have been omitted from FIG. 11, their action having been described above.

Figure 5:
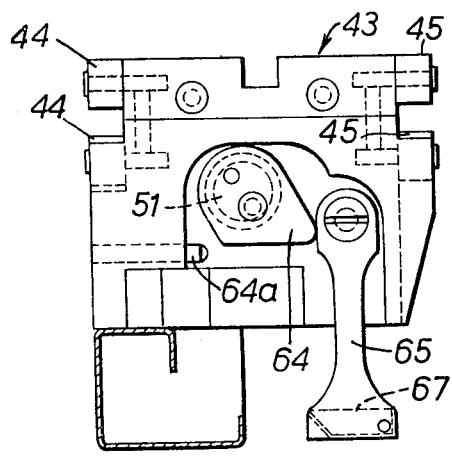
Figure 6:
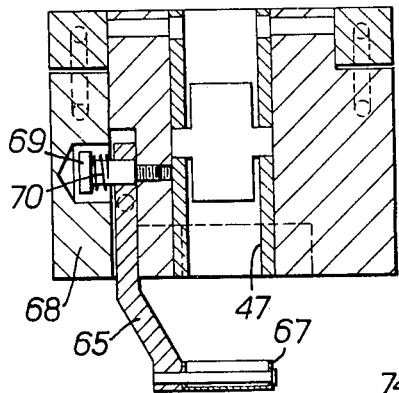

During initial downward movement of the punch 54, cam 64 is rotated in a clockwise direction as seen in FIG. 5 and this allows arm 65 to pivot in an anti-clockwise direction under the action of spring 70 so moving the tray 67 clear of the path of movement of the punch. The tray returns to a position beneath the punch as the latter completes its upward movement in readiness to receive discs rejected from the hollow punch.

In an alternative embodiment of the invention the ejector rod 61 is omitted and the punch-out discs 84 are allowed to accumulate in the bore 85 travelling along the latter as punching continues until they reach the somewhat larger space 86 within the hollow punch 54 above the bore 85. The space 86 thus acts as a collecting space from which discs are removed by means of an air flow upwardly through the space. The air flow may be produced by connecting the upper end of the space 86 to a vacuum pump which draws air through the space from an orifice in the wall of the space 86 in the vicinity of its junction with the bore 85. The discs are entrained in the stream of air and conveyed to a disposal point and discharged into a collecting box.

Alternatively, the bore 85 may be connected to a source of air under pressure to eject the discs from the bore 85 passed the cutting edge 83 at a suitable point in the punch cycle.

Yet again, the discs may be allowed to accumulate in the collecting space 86 to be removed periodically by detaching the punch 54 from its holder and inverting it. If it is not desired to detach the punch, the wall of the collecting sapce may have a discharge orifice through which the discs are discharged under pressure from further discs entering the bore 85 as a result of further punching operations.

Although in the embodiment described above, the punch is manually operated, it will be understood that power operation may be provided if desired, downward and upward movement of the punch being defined by appropriate limit devices.

Although in the above described embodiment colour separations are referred to it will be understood that the process may be used to register films other than colour films, for example black and white films, halftone films, outline drawings and washes of various kinds.

I claim:

1. A montage or "light" table comprising a structure movable along the table, a punch mechanism including a hollow cutting punch mounted upon the structure for movement relatively thereto across the table, a core member within the hollow punch and movable relatively thereto to eject punched-out discs within the hollow punch, means for reciprocating the hollow cutting punch to effect a punching operation by cutting, a receptacle for discs and further means for moving the receptacle between a first position, beneath the hollow punch to receive discs ejected from the hollow punch by the core member, and a second position clear of the path of reciprocation of the hollow punch.

2. A table as claimed in claim 1 in which said structure comprises side members mounted for movement along parallel sides of the table, a cross member connected between the side members, and guide surfaces upon the cross member, said punch mechanism being mounted upon said guide surfaces for movement therealong.

3. A table as claimed in claim 1 in which the punch mechanism includes a punch carrier for carrying the hollow punch, the carrier having a toothed rack disposed longitudinally of the carrier, a pinion in meshing engagement with the rack, an axle mounted for rotation about its longitudinal axis, the pinion being secured to the axle, and a handle for rotating the axle.

4. A table as claimed in claim 3 and further comprising a cam member mounted upon the axle, a pivotally mounted arm carrying a receptacle for receiving punch-out discs, and resilient biassing means urging the arm into contact with the cam member.

5. A table as claimed in claim 1 and further comprising a non-perforate layer of relatively soft material supported on the table.

* * * * *